United States Patent
Choi

(10) Patent No.: US 7,521,771 B2
(45) Date of Patent: Apr. 21, 2009

(54) METHOD FOR FABRICATING A SEMICONDUCTOR DEVICE

(75) Inventor: Yong Keon Choi, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 30 days.

(21) Appl. No.: 11/024,748

(22) Filed: Dec. 30, 2004

(65) Prior Publication Data

US 2005/0139865 A1 Jun. 30, 2005

(30) Foreign Application Priority Data

Dec. 31, 2003 (KR) .................... 10-2003-0101929

(51) Int. Cl.
*H01L 29/00* (2006.01)

(52) U.S. Cl. ................ 257/501; 257/500; 257/E21.546

(58) Field of Classification Search ......... 438/218–223, 438/207; 257/374, E21.548, E21.549, E21.572, 257/E27.062, 500, 501
See application file for complete search history.

(56) References Cited

U.S. PATENT DOCUMENTS

| | | | | |
|---|---|---|---|---|
| 4,495,025 A | * | 1/1985 | Haskell | 438/427 |
| 4,609,934 A | * | 9/1986 | Haskell | 257/374 |
| 5,937,288 A | * | 8/1999 | Alsmeier et al. | 438/221 |
| 6,001,706 A | * | 12/1999 | Tan et al. | 438/424 |
| 6,267,479 B1 | * | 7/2001 | Yamada et al. | 257/392 |
| 6,320,233 B1 | * | 11/2001 | Yamaguchi et al. | 257/369 |
| 6,365,952 B1 | * | 4/2002 | Akram | 257/510 |
| 6,406,976 B1 | | 6/2002 | Singh et al. | |
| 6,468,849 B1 | * | 10/2002 | Efland et al. | 438/200 |
| 6,468,860 B1 | * | 10/2002 | Polavarapu et al. | 438/257 |
| 6,562,696 B1 | * | 5/2003 | Hsu et al. | 438/424 |
| 6,642,125 B2 | * | 11/2003 | Oh et al. | 438/427 |
| 6,794,254 B1 | * | 9/2004 | Tzeng et al. | 438/283 |
| 6,809,014 B2 | * | 10/2004 | Mathew et al. | 438/514 |
| 6,849,919 B2 | * | 2/2005 | Sumino et al. | 257/510 |
| 6,879,007 B2 | * | 4/2005 | Takamura | 257/392 |
| 7,049,206 B2 | * | 5/2006 | Akram | 438/427 |
| 2003/0124813 A1 | * | 7/2003 | Lee | 438/400 |
| 2003/0207525 A1 | * | 11/2003 | Trivedi | 438/200 |

FOREIGN PATENT DOCUMENTS

KR 2002-0072984 9/2002

* cited by examiner

*Primary Examiner*—Wai-Sing Louie
(74) *Attorney, Agent, or Firm*—Lowe Hauptman Ham & Berner, LLP

(57) ABSTRACT

A semiconductor device including a semiconductor substrate having first and second device regions. A first trench is formed in the first region and a second trench is formed in the second region. The first trench and the second trench have different widths and different depths. The first trench and the second trench define device isolation regions and active regions.

10 Claims, 5 Drawing Sheets

US 7,521,771 B2

METHOD FOR FABRICATING A SEMICONDUCTOR DEVICE

BACKGROUND OF THE INVENTION (a) Field of the Invention

The present invention relates to a semiconductor device, and in particular, to a semiconductor device having a gate to which different voltages are applied and a method for fabricating the semiconductor device.

(b) Description of the Related Art

As semiconductor devices have been implemented for various applications, different device characteristics are required. For example, there can be a device such as a logic and central processing unit (CPU) merged with Dynamic Random Access Memory (DRAM) or Static Random Access Memory (SRAM). Accordingly, a high voltage device and low voltage device are formed in a single substrate.

The operation voltage of the chip varies according to the characteristics of respective devices integrated in the single chip. Thus, even though some components perform identical functions, their volume and size differ from each other according to the input voltages.

FIG. 1 is a cross sectional view illustrating a conventional CMOS of a high voltage region.

Referring to FIG. 1, P and N wells 102 are formed in an active region defined by a device isolation region 110 which is formed by filling a trench (T) formed within a substrate 100. Below the device isolation region 110, channel stop regions 112 are formed by doping the impurity ions of a type identical to those of the wells 102, respectively.

An NMOS transistor is formed in the P well of the high voltage region. An active region divided by the device isolation region 110 and a PMOS transistor is formed in the N well. In the drawing only a gate 114 and a gate dielectric layer 113 of the respective thin layer transistor are depicted. The channel stop regions 112 are positioned below the device isolation region between the P type transistor and the N type transistor and prevent the two devices from affecting each other.

However, the conventional method has drawbacks in that the fabrication processes are so complicated. The conventional processes are also limited in miniaturizing the size of the device, because the sizes of the device isolation region and the active region should be designed in consideration of the channel stop region.

SUMMARY OF THE INVENTION

The present invention has been made in an effort to solve the above problems. It is an object of the present invention to provide a semiconductor device and a fabrication method thereof, which is capable of minimizing the semiconductor device as well as simplifying the fabrication processes.

To achieve the above object, in the present invention the trench defining a device isolation region between a high voltage region and a low voltage region may be formed in double depths.

In one aspect of the present invention, the semiconductor device includes a semiconductor substrate having first and second device regions and trenches formed in the first and second device regions, with different widths and different depths, which define device isolation regions and active regions.

In an exemplary embodiment, the first device region is provided with a CMOS to which high voltage is applied and the second device region is provided with a CMOS to which low voltage is applied.

In an exemplary embodiment, the trench of the first device region is provided with stepped sidewalls.

In an exemplary embodiment, the trench of the first device region includes a first region of a first width and a second region of a second width.

In an exemplary embodiment, the first region is formed with a depth identical to the depth of the device isolation region of the second device region. In an exemplary embodiment, the trench is filled with dielectric material.

In an exemplary embodiment, the dielectric material is an oxide layer.

In another aspect of the present invention, a method for fabricating a semiconductor device includes forming first and second trenches for defining device isolation regions in first and second device regions of a semiconductor substrate, forming a third trench by selectively etching a predetermined area of the substrate within the first trench, and filling the first to third trenches with dielectric material.

In an exemplary embodiment, the method further includes forming an oxide layer by oxidizing inner walls of the first to third trenches before filling the dielectric material.

In an exemplary embodiment, the third trench is formed narrower than the first trench.

In an exemplary embodiment, the third trench is formed deeper than the second trench.

In an exemplary embodiment, the third trench is formed below the first trench and with stepped sidewalls.

It is to be understood that both the foregoing general description of the invention and the following detailed description are exemplary, but are not restrictive of the invention.

DETAILED DESCRIPTION OF THE INVENTION

A semiconductor device according to an exemplary embodiment of the present invention will be described in detail with reference to the accompanying drawings.

Figure 1:
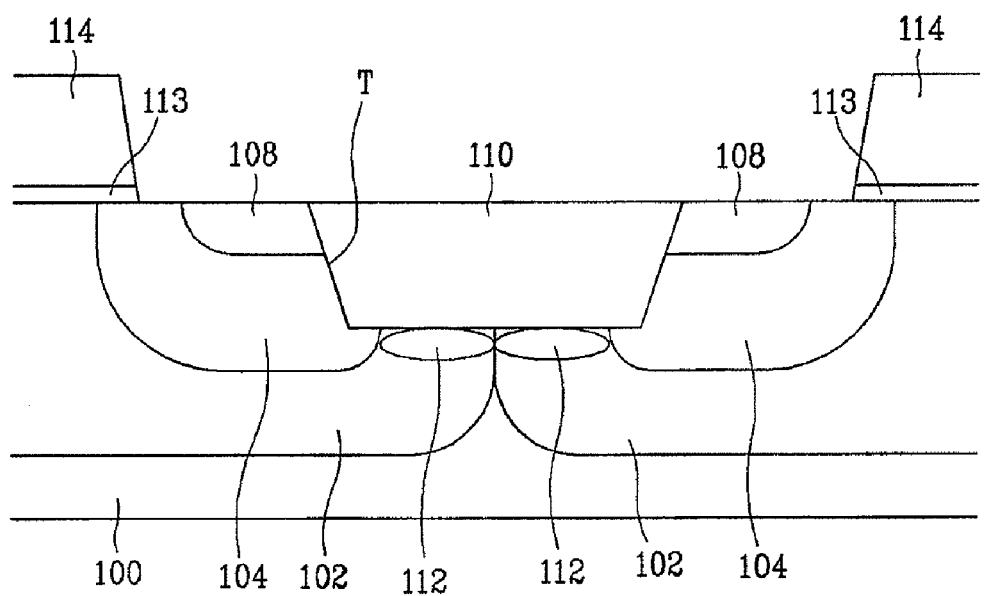
FIG. 1 is a cross sectional view illustrating a conventional CMOS of a high voltage region.
Figure 2:
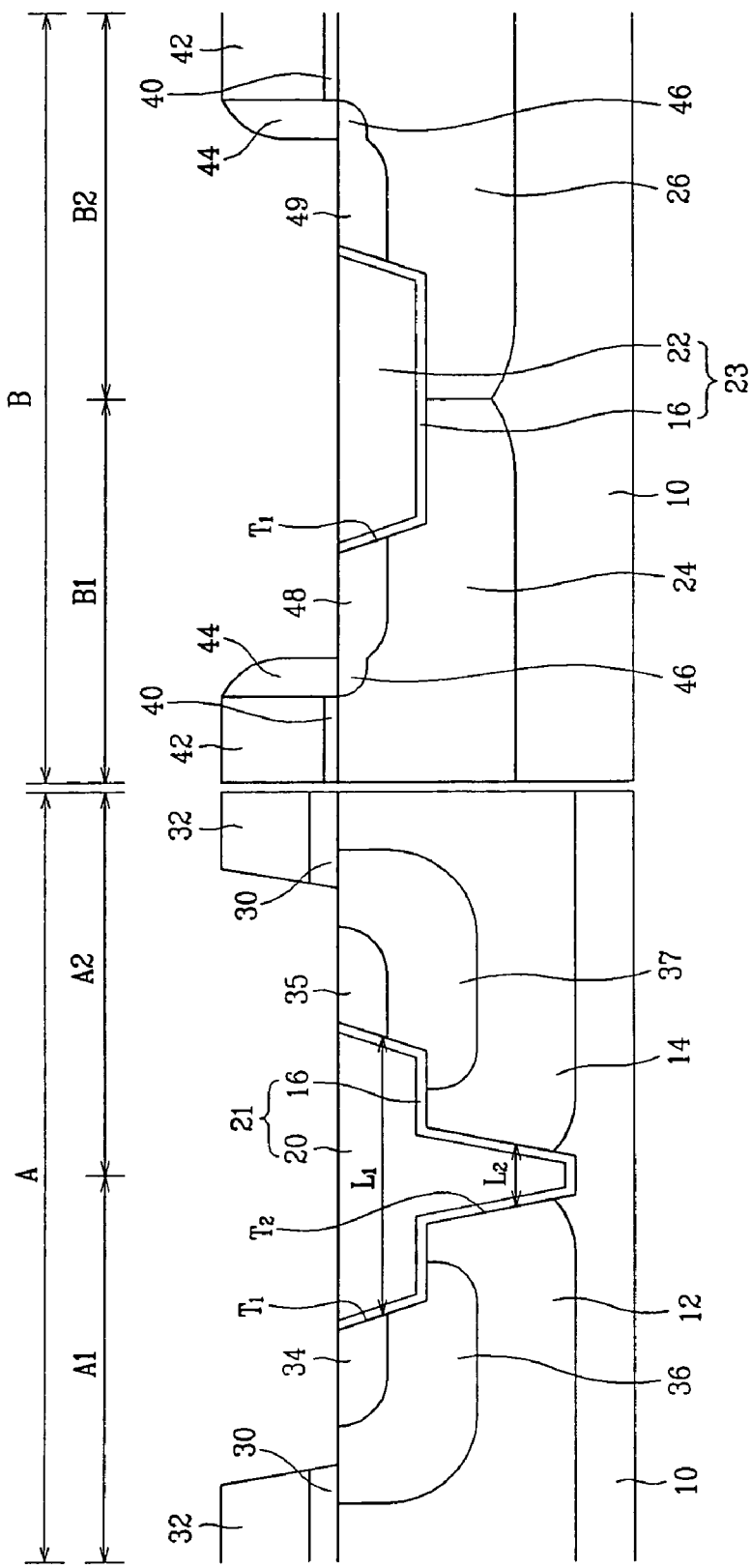
FIG. 2 is a cross sectional view illustrating a structure of a semiconductor device according to an exemplary embodiment of the present invention.

As shown in FIG. 2, the semiconductor device includes a plurality of high voltage regions A and low voltage regions B. The respective high and low voltage regions A and B are divided into first and second high voltage active regions A1 and A2 and first and second low voltage active regions B1 and B2 by respective device isolation regions 21 and 23 formed by trenches T1 and T2.

The device isolation region 21 of the high voltage region A includes an oxide layer 16 formed thinly along inner walls of the trenches T1 and T2, and a dielectric material layer 20 filling the trench coated by the oxide layer 16. In a similar manner, the device isolation region 23 of the low voltage region B includes the oxide layer 16 formed thinly along inner walls of the trench T1, and a dielectric material layer 22 filling the trench coated by the oxide layer 16.

In more detail, the trenches T1 and T2 of the high voltage region A are formed with different widths so as to have stepped sidewalls, the widths of the trenches T1 and T2 being L1 and L2, respectively. That is, the upper trench T1 is formed with a broad width of L1 and the lower trench T1 is formed below the first trench with a narrow width L2. The lower trench is formed deeply so as to completely block the interaction between the neighboring active regions. The depth of the lower trench T2 is greater than the depth of the P and N wells.

In the first and second active regions A1 and A2 of the high voltage region A, the P and N well regions 12 and 14 doped at a low concentration level are formed, respectively. An NMOS transistor is formed in the P well region 12 and a PMOS transistor is formed in the N well region 14, which are roughly depicted in the drawings.

The NMOS transistor is doped at a high concentration level so as to define the channel region. The NMOS transistor includes a source region (not shown) and a drain region 34 doped with the N type impurity at a high concentration level, a low doping concentration region 36 formed between the channel region and the respective source and drain regions by doping with N type impurity, and a gate oxide layer 30 and a gate 32 formed at the channel region on the substrate in sequential order.

The gate 32 can be formed out of polycrystalline silicon or metal. The gate oxide layer 30 between the substrate and the gate 32 can be formed by thermally oxidizing the substrate or depositing silicon oxide through chemical vapor deposition.

The PMOS transistor formed in the N well region has an identical structure to the NMOS transistor, however, the impurity doped into the source region 35, the drain region (not shown), and the low doping concentration region 37 is N type impurity.

Regarding the structure of the low voltage region B, the device isolation region 23 is formed on the substrate 10 using an STI technique, and the N type well 26 and the P type well 24 is formed within the substrate 10.

In the N type well 26 a gate oxide layer 40 and a gate 42 having spacers 44 are formed. Below the spacers 44, low doping concentration regions 46 are formed by doping the impurity ions at a low concentration level. A source region 49 and a drain region (not shown) are formed by doping the impurity ions at a high concentration level so as to contact the low doping concentration region 46. The low doping concentration region 46, the source region, and the drain region are doped with P type impurity ions.

Also, in the P type well 24 a gate oxide layer 40 and a gate 42 having spacers 44 are formed. Below the spacers 44, low doping concentration regions 46 are formed by doping the N type impurity ions at a low concentration level, and a source region 48 and the drain region (not shown) are formed by doping the N type impurity ions at a high concentration level, so as to contact the low doping concentration regions 46.

The trench T1, defining the device isolation region of the low voltage region B, is formed with a single width and shallow depth in comparison with the trench T1 and T2 of the high voltage region A. Also, the low doping concentration region 46 and the P and N wells 24 and 26 are formed thinner and narrower than those of the high voltage region A.

A method for fabricating the above structured semiconductor device according to an exemplary embodiment invention will be described herein after with reference to FIG. 3 to FIG. 5 together with FIG. 2.

Figure 3:
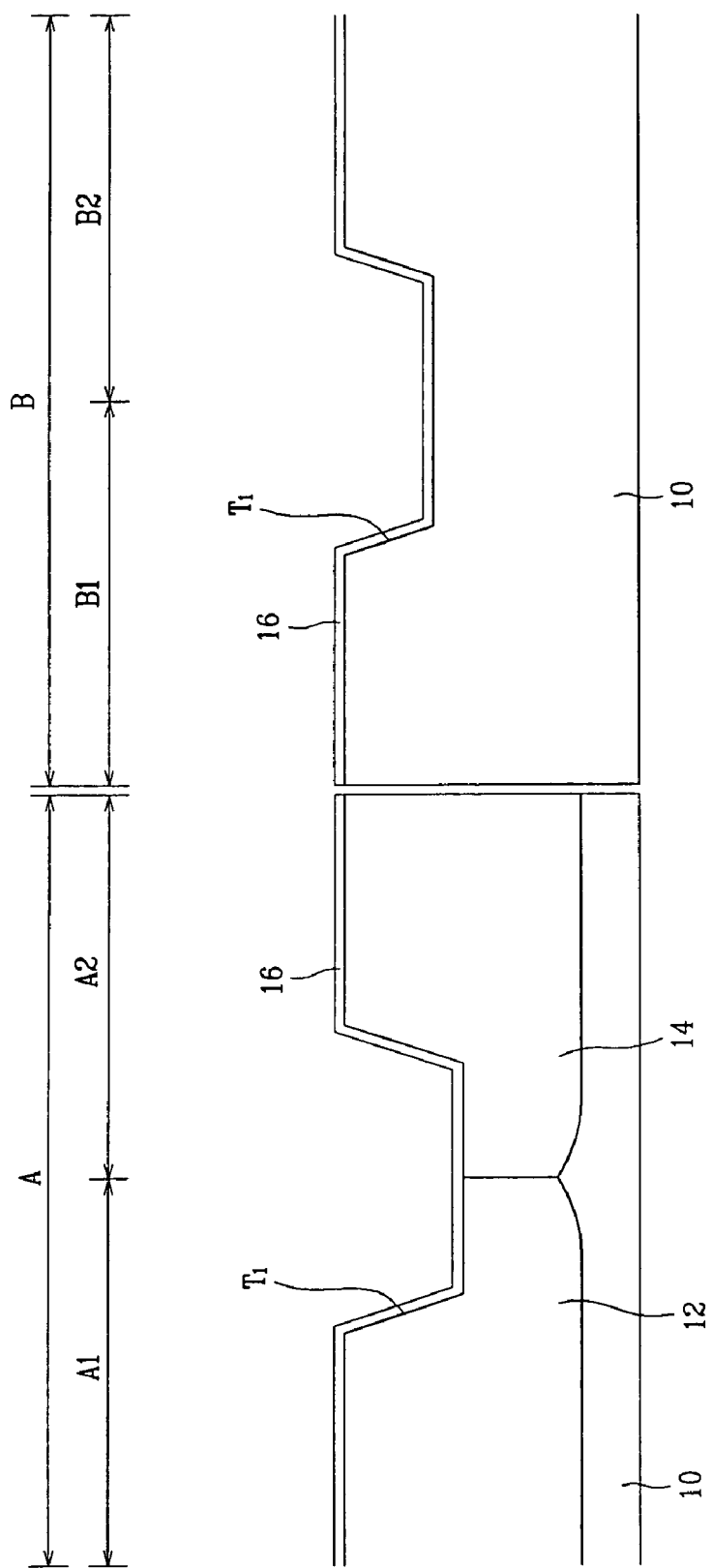
FIG. 3 to FIG. 5 are cross-sectional views illustrating fabrication steps of the semiconductor device according to an exemplary embodiment of the present invention.

As shown in FIG. 3, P and N wells capable of withstanding high voltage are formed on predetermined regions of a semiconductor substrate 10 by injecting P and N type impurities, respectively. The low doping concentration region is protected by a photoresist film.

After forming the photoresist film on the substrate, a first photoresist pattern is formed through a photolithographic process. The substrate is etched using the first photoresist pattern as a mask so as to form shallow trenches in the high voltage region A and the low voltage region B, respectively.

After removing the first photoresist pattern (PR), thin oxide layer 16 is formed on the inner walls of the shallow trench T1 by oxidizing the substrate 10. The oxide layer 16 alleviates the stress between the dielectric material to be buried in the following process and the semiconductor substrate, and minimizes errors caused by reflection during the exposure in the photolithography process using the photoresist layer.

Figure 4:
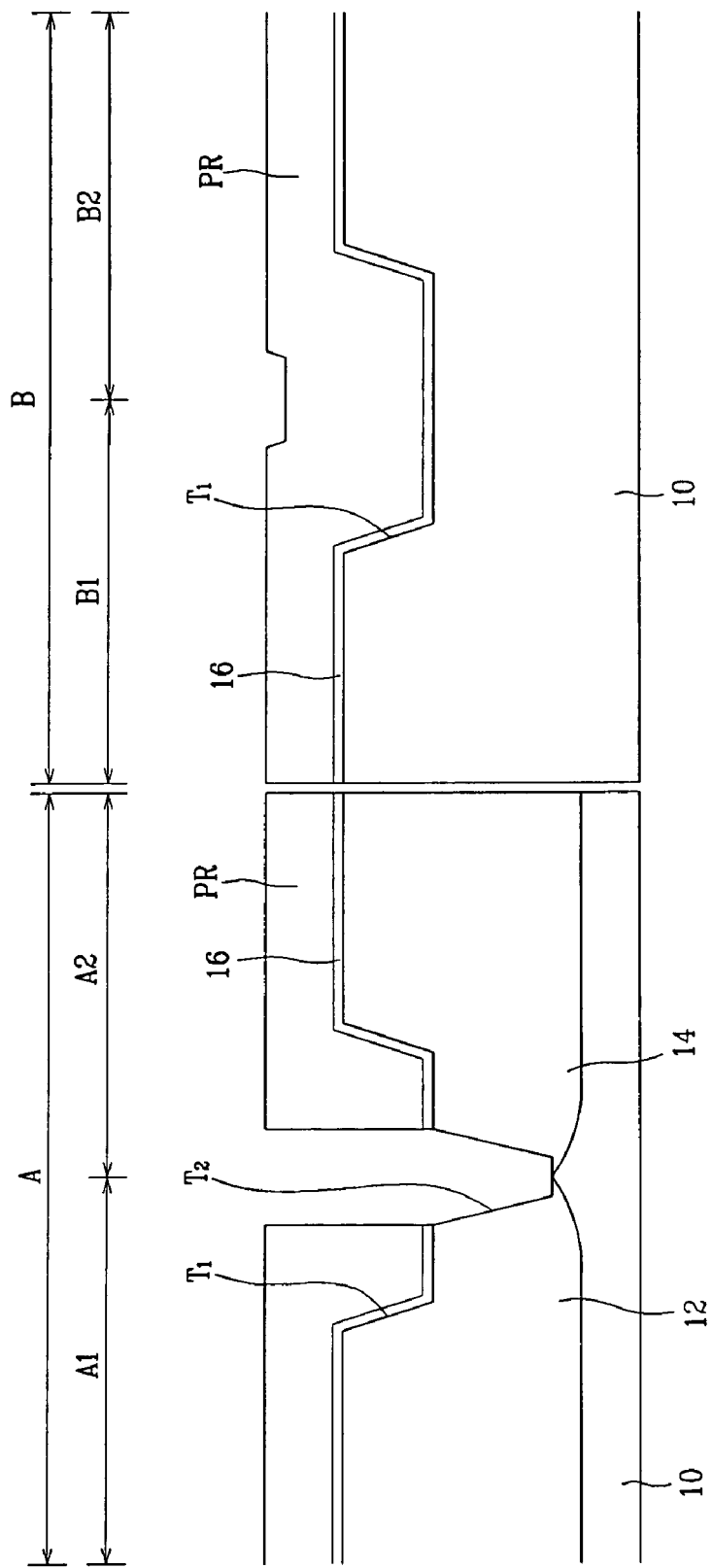

As shown in FIG. 4, the second photoresist pattern (PR) exposes predetermined areas of the bottom surface of the shallow trench T1 of the high voltage region A. This is accomplished by forming the photoresist on the substrate and patterning the photoresist through the photolithography process. The deep trench T2 is formed by etching the exposed substrate below the shallow trench T1 using the second photoresist pattern (PR) as a mask. The width of the deep trench T2 is narrower than that of the shallow trench T1.

Figure 5:
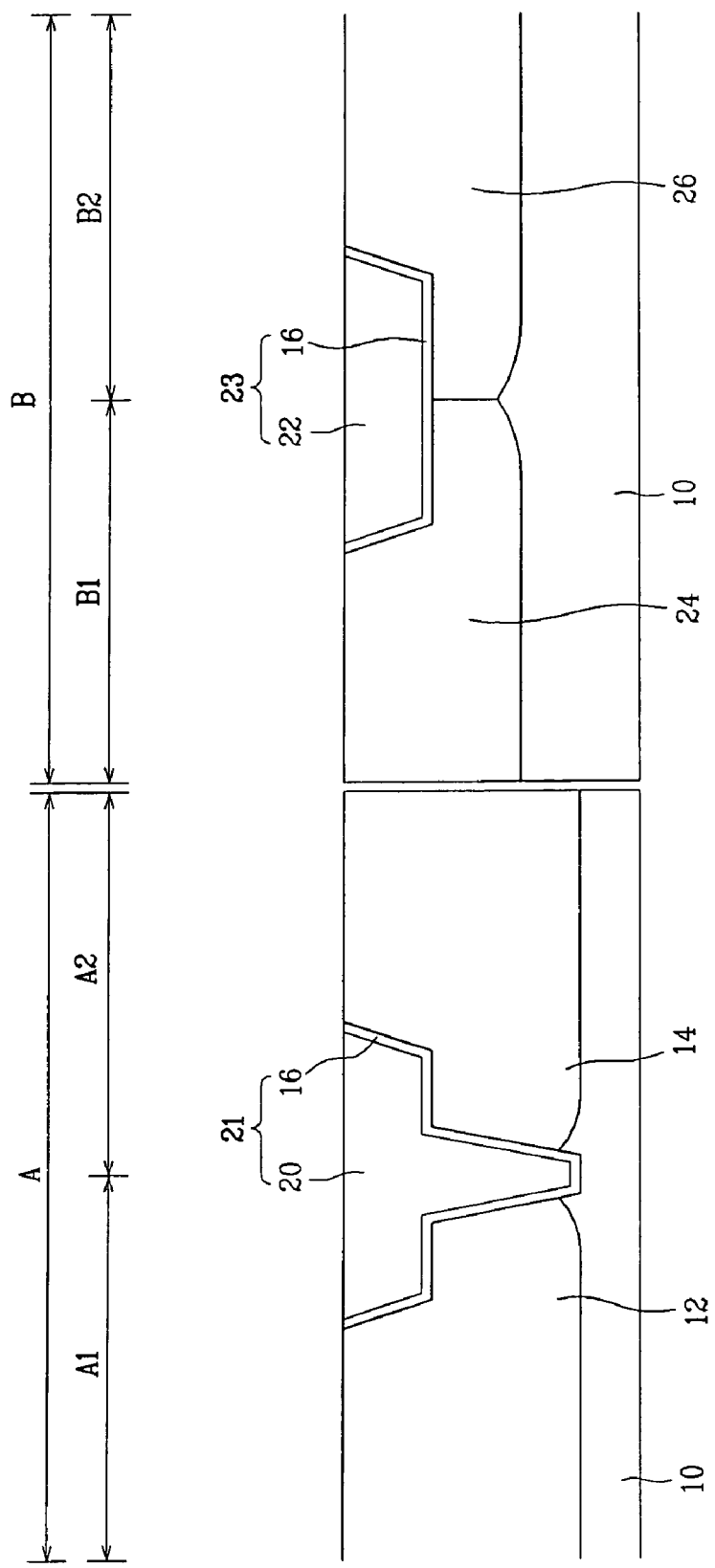

As shown in FIG. 5, after removing the photoresist pattern (PR), a thin oxide layer is formed on the inner walls of the deep trench T2 by oxidizing the substrate 10. The oxide layer alleviates the stress between the dielectric material to be buried in the following process and the substrate 100, and can be optionally formed as needed.

The trenches T1 and T2 are coated by the oxide layer 16 and filled with the dielectric material. The dielectric material is made smooth with a chemical mechanical polishing process, so as to completely form the device isolation regions 21 and 23 for the high voltage and low voltage regions.

The trenches T1 and T2 in the high voltage region are formed with different widths. This makes it possible to form the device isolation region 21 satisfying the required characteristic of the high voltage region without changing the structure of the device isolation region 23 of the low voltage region B. Also, the device isolation region 21 of the high voltage region A is formed to the depth of the wells 12 and 14. This makes it possible to simplify the fabrication process, because there is no need to form a channel stop layer below the device isolation region, which is formed by doping the impurity ions.

In the semiconductor device fabrication method according to an exemplary embodiment of the present invention, following processes that are not directly related to the present invention will be schematically explained.

As shown in FIG. 2, the gate oxide layers 30 and 40 and the gates 32 and 42 having different thicknesses are formed in the respective active regions A1, A2, B1, and B2. Before or after forming the gate, the low doping concentration regions 36, 37, and 46 and the high doping concentration regions 36, 37, 48, and 49 are formed.

As described above, the device isolation regions can be formed with different depths and widths, such that it is not required to form the channel stop layer. Accordingly, there is no need to carry out the ion injection and photolithography process for forming the channel stop layer, such that the fabrication process of the semiconductor device becomes simplified.

Also, the device isolation regions having various contours suitable for the respective high and low voltages regions can be formed by changing the structure of the low voltage region.

Also, since the semiconductor device fabrication method of the present invention does not require a process for forming a channel stop layer, the fabrication process becomes simplified, resulting in an increase in productivity.

As described above, the trench defining the device isolation region of the high voltage region is formed in double depth such that it is possible to reduce the width of the device isolation region, resulting in miniaturization and integration of the semiconductor device.

Korean Patent Application No. 10-2003-0101929, filed on Dec. 31, 2003, is incorporated herein by reference in its entirety.

Although exemplary embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method for fabricating a semiconductor device, the method comprising:
   providing a semiconductor substrate having a high voltage region and a low voltage region;
   forming wells to a depth selected to withstand high voltage in the high voltage region of the semiconductor substrate;
   forming a first and a second trench for defining device isolation regions in the high voltage region and the low voltage region, respectively, of the semiconductor substrate;
   forming a third trench to the depth of the wells by selectively etching a predetermined area of the substrate within the first trench formed in the high voltage region after forming the first trench, the third trench being formed deeper than the first trench; and
   filling the first to the third trenches with a dielectric material.

2. The method of claim 1, wherein the third trench is formed narrower than the first trench.

3. The method of claim 1, wherein the third trench is formed deeper than the second trench.

4. The method of claim 1, wherein the first and third trenches comprises a trench with stepped sidewalls.

5. The method of claim 1, wherein the high voltage region comprises an NMOS transistor region and PMOS transistor region, and the first and third trenches are formed between the NMOS and PMOS transistor regions.

6. The method of claim 1, wherein the high voltage region and the low voltage region are formed side-by-side on the substrate.

7. The method of claim 1, further comprising the step of forming an oxide layer over the first and third trenches before the step of filling the first and third trenches with the dielectric material.

8. The method of claim 1, wherein the first and third trenches are formed in the high voltage region and distal from the low voltage region.

9. The method of claim 1, wherein the first and third trenches separate transistor source and drain regions.

10. The method of claim 1 wherein the third trench is formed to a depth which extends below the wells formed in the high voltage region.

* * * * *